United States Patent [19]
Gaither et al.

[11] Patent Number: 5,133,045
[45] Date of Patent: Jul. 21, 1992

[54] METHOD FOR OPERATING A REAL-TIME EXPERT SYSTEM IN A GRAPHICAL PROGRAMMING ENVIRONMENT

[75] Inventors: Shawn A. Gaither, Saratoga; Sunil C. Shah, Mountain View, both of Calif.

[73] Assignee: Integrated Systems, Inc., Santa Clara, Calif.

[21] Appl. No.: 790,127

[22] Filed: Nov. 6, 1991

Related U.S. Application Data

[63] Continuation of Ser. No. 553,157, Jul. 13, 1990, abandoned.

[51] Int. Cl.⁵ .............................................. G06F 15/46
[52] U.S. Cl. ...................................... 395/51; 395/12; 395/76; 395/700; 395/68
[58] Field of Search ....................... 395/51, 75, 76, 68, 395/700, 12

[56] References Cited

U.S. PATENT DOCUMENTS

| | | | |
|---|---|---|---|
| 4,656,603 | 4/1987 | Dunn | 364/900 |
| 4,796,179 | 1/1989 | Lehman et al. | 364/300 |
| 4,813.013 | 3/1989 | Dunn | 364/900 |
| 4,827,418 | 5/1989 | Gerstenfeld | 364/439 |
| 4,949,267 | 8/1990 | Gerstenfeld et al. | 364/439 |
| 4,975,865 | 12/1990 | Carrette et al. | 364/513 |

OTHER PUBLICATIONS

Aström et al., "Expert Control", 1986.
Sauers, Ron, "Controlling Expert Systems," *Expert Systems Applications*, Germany 1988, pp. 79-197.
Prade, Henri, "A Quantitative Approach to Approximate Reasoning in Rule-Based Expert Systems," *Expert Systems Applications*, Germany 1988, pp. 199-256.

*Primary Examiner*—Allen R. MacDonald
*Attorney, Agent, or Firm*—Flehr, Hohbach, Test, Albritton & Herbert

[57] ABSTRACT

A method is disclosed for operating a real-time multi-rate and discrete even computer system for simulation and automatic code generation of modelled systems requiring both expert system technology and conventional algorithms. Simulation of a system to be modelled proceeds on data inputs to yield outputs as responses of the simulated system to data inputs for assembling an organized catalog of blocks, both conventional and expert system, based on the operational rates and time skews. These blocks can be assembled for automatic code generation so that all blocks operating with identical rates and time skews can be organized within a single subsystem. Code is then generated for each subsystem, including code for a scheduler to run the entire system thus modelled. Each expert system block generates its own inference engine, and set of parameters representing the knowledge base, and storage allocation for the data base.

27 Claims, 12 Drawing Sheets

```
╔═══════════════════════════════════════════════════╗
║▓▓▓ TYPE=Expert System              ID=99      KB ║
║                                                   ║
║  BLOCK NAME       INPUTS         OUTPUTS          ║
║  Controller Logic ☒   3             4             ║
║                                                   ║
║  Access Name:  INCREASE_SPEED     Rule            ║
║                                                   ║
║  NAME INCREASE_SPEED;                             ║
║  IF (SPEED_ERROR)>5;                              ║
║  THEN NOT REDUCE_SPEED INCREASE_SPEED;            ║
║  THEN [EQT(TARGET_ACCELERATION) (ACCELERATION_RATE)]; ║
║  ELSE;                                            ║
║  PRIORITY 3;                                      ║
║  CONFIDENCE 1;                                    ║
║  Strategy : Priority                              ║
║                                                   ║
║  Truth Level : 0.75                               ║
║  Maximum Rule Executions per Data Cycle : 10      ║
║  Update Comparisons ....... : Yes                 ║
║  Reinitialize Logicals ..... : No                 ║
║  Order Assertions ......... : No                  ║
║  History File ............. : No                  ║
║         Input External_Signals         Output Labels ║
║  1 "Cruise Control On"         1 "Target Acceleration" ║
║  2 "Automobile Speed"          2 "Automobile Speed"    ║
║  3 "Desired Speed"             3 "Increase Speed"      ║
║                                4 "Speed Error"         ║
║                           .COMMENTS                    ║
║  ┌──────┐ VIEW_INPUT      COLOR  ICON    IN_PINS   OUT_PINS  LABELS ┌────┐║
║  │CANCEL│ External Signals  0   Special  Show_All  Show_All    On  │DONE│║
║  └──────┘                                                          └────┘║
╚═══════════════════════════════════════════════════╝
```

FIG. 3a

FIG. 3b (Rotated screen content:)

BLOCK NAME    TYPE=Expert System    ID=99

Controller Logic

Access Name:   PARAMETERS      Rule     INPUTS    OUTPUTS
                                                       3        4

SPEED_ERROR          =   0;
TARGET_ACCELERATION =   0;
ACCELERATION_RATE    =   3;
DECELERATION_RATE    =  -3;

Strategy : Priority

Truth Level : 0.75
Maximum Rule Executions per Data Cycle : 10
Update Comparisons ...... : Yes
Reinitialize Logicals ...... : No
Order Assertions ...... : No
History File ...... : No Input External_Signals                          Output Labels
1 "Cruise Control On"                          1 "Target Acceleration"
2 "Automobile Speed"                         2 "Automobile Speed"
3 "Desired Speed"                                 3 "Increase Speed"
                                                                            4 "Speed Error"

COMMENTS

| VIEW_INPUT | COLOR | ICON | IN_PINS | OUT_PINS | LABELS |
|---|---|---|---|---|---|
| External Signals | 0 | Special | Show_All | Show_All | On |

CANCEL                                                                                                                                                                                  DONE

KB

```
TYPE=Expert System                    ID=99

BLOCK NAME
Controller Logic                                                          KB Access Name: INPUTS           INPUTS              OUTPUTS
                                3                    4
                              Rule

1. ENABLED;
2. AUTO_SPEED;
3. DESIRED_SPEED;

Strategy : Priority

Truth Level : 0.75
Maximum Rule Executions per Data Cycle : 10
Update Comparisons ...... : Yes
Reinitialize Logicals   ...... : No
Order Assertions     ...... : No
History File          ...... : No
         Input External_Signals                Output Labels
1 "Cruise Control On"                    1 "Target Acceleration"
2 "Automobile Speed"                     2 "Automobile Speed"
3 "Desired Speed"                        3 "Increase Speed"
                                         4 "Speed Error"
                              COMMENTS VIEW_INPUT      COLOR   ICON     IN_PINS   OUT_PINS   LABELS
CANCEL   External Signals   0    Special  Show_All  Show_All     On     DONE
```

FIG. 3c

EXPERT SYSTEM RULES MANAGER

SELECTED RULES

| Name of Rule | If | Then | Else | Priority | Confidence |
|---|---|---|---|---|---|
| ENABLE_EXPERT_SYSTEM | 1 | 2 | 1 | 5 | 1.0000 |
| INCREASE_SPEED | 1 | 4 | 0 | 3 | 1.0000 |
| REDUCE_SPEED | 1 | 4 | 0 | 3 | 1.0000 |
| REGULATE_SPEED1 | 2 | 5 | 0 | 3 | 1.0000 |
| REGULATE_SPEED2 | 2 | 5 | 0 | 3 | 1.0000 |

Filename (Save/Load) : EXPERT.DAT
Select Rules Keyword :

SORT RULES
Alphabetical

[CANCEL] [INPUTS] [NEW RULE] [COPY] [PARAMS] [UPDATE] [LOAD] [SAVE] [DONE]

FIND RULES
ALL

FIG. 3d

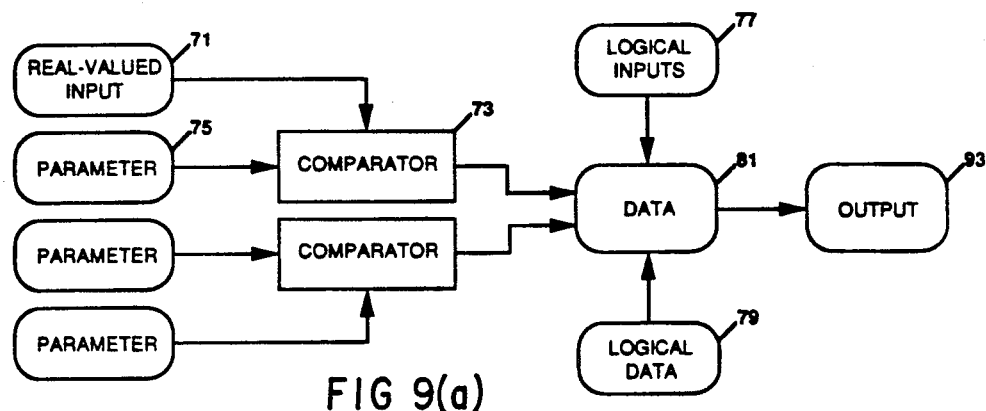
FIG 9(a)
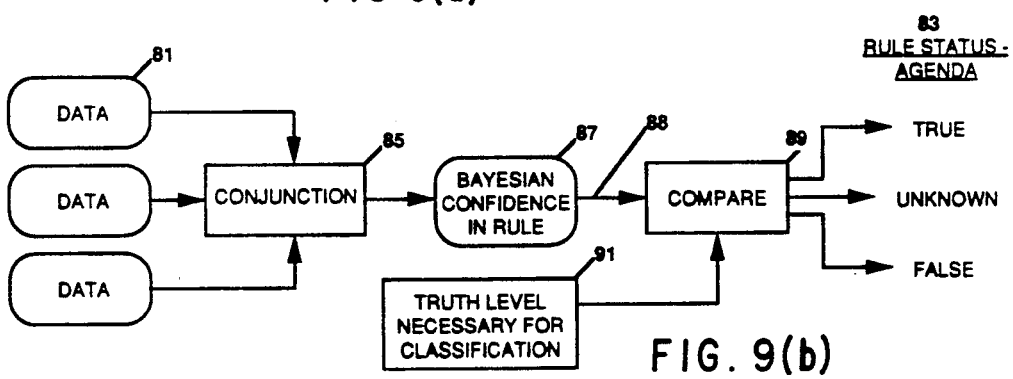
FIG. 9(b)
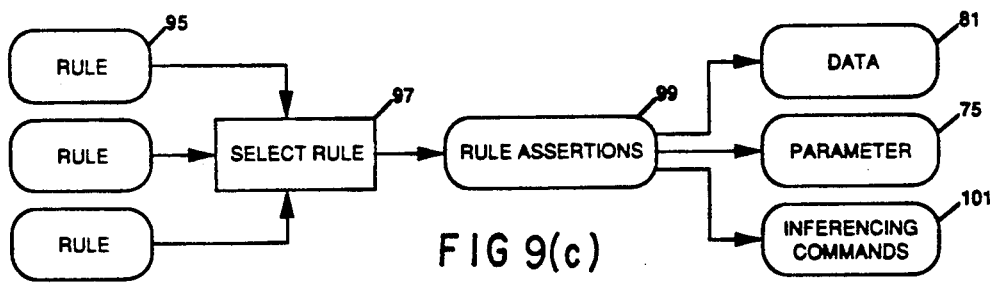
FIG 9(c)
EXPERT SYSTEM STATES BUS
| PARAMETER | DATA STATUS | DATA VALUE | DATA TIMETAG | RULE VALUE | RULE TIMETAG | RULE STATUS |
|---|---|---|---|---|---|---|
| 103 | 105 | 107 | 109 | 111 | 113 | 115 |
FIG. 9(d)

METHOD FOR OPERATING A REAL-TIME EXPERT SYSTEM IN A GRAPHICAL PROGRAMMING ENVIRONMENT

This is a continuation of application Ser. No. 07/553,157, filed Jul. 13, 1990, now abandoned.

RELATED CASE

The subject matter of this application relates to the subject matter which is set forth in U.S. Pat. No. 4,796,179 and which is incorporated herein by this reference.

FIELD OF THE INVENTION

The present invention relates generally to systems utilizing a graphical programming environment, or block diagram type of representation, to simulate realtime multirate and discrete event systems consisting of conventional, algorithmic and expert system components, and particularly to computer systems which generate computer programs for such processes.

BACKGROUND OF THE INVENTION

The storage and retrieval of knowledge in a definable fashion usually falls into one of two categories; namely: conventional algorithms and symbolic knowledge. Conventional algorithms typically express knowledge in a manner in which a certain set of inputs and states will always produce the same outputs utilizing an explicit step-by-step procedural algorithm. Symbolic knowledge, however, is used to describe situation where several pieces of data are given along with definable knowledge which must be used to find an answer. Unlike conventional knowledge, there is no algorithmic way to use the knowledge, only "rules of thumb" to determine which knowledge is pertinent given the current data. This is the essence of an expert system in that; much knowledge exists, but only some portions of the knowledge are useful at any point in solving the problem. An expert system typically uses an inference engine to decide which action to take next until the problem is solved.

Knowledge can be represented in many ways including classification, rules, and inheritance. In real-time applications, however, rules are typically the only representation of knowledge which can be utilized in a timely fashion, especially in the case where a system is data-driven. A data-driven system is one in which the data decides which action to take as opposed to a goal-driven system in which a goal is the basis for all actions.

A rule-based expert system is easily recognizable by the fact that all knowledge is contained in IF-THEN-ELSE rules, where the IF condition is evaluated with respect to its truth value, and the corresponding THEN-ELSE assertion is carried out. A rule-based expert system usually includes three main parts: namely: a knowledge base containing the rules, a data base containing values and timetags of all pertinent data, and an inference engine which acts on the data based on the rules. The inference engine uses a strategy composed of several heuristics, or "rules of thumb", in order to narrow down a multitude of rules to a few pertinent rules.

The process of applying knowledge typically involves three steps in a rule-based system. First, all rules are evaluated as to their capability to be used with respect to the status of the data comprising the rule. Second, out of the available set of applicable rules, one rule is chosen using the set of heuristics. Third, that rule is then executed typically updating the data base, but possibly changing the rule base as well. This procedure is repeated until there is no new information to apply or a solution has been reached.

Rule-based expert system are often desired for real-time systems for several reasons. First, rules are a simple form of knowledge which are easy to formulate based on the user's experience. Second, real-time applications often demand a simpler rule-based approach since object-oriented expert system applications typically stretch beyond the limits of timely solutions. Third, the rule-base approach is best suited to the data-driven problems typically encountered in real-time applications.

However, most expert systems have several shortcomings. The user interfaces are tightly coupled to the run-time code, resulting in significant and often specialized computing resources. Conventional expert systems cannot enforce hard deadlines and do not explicitly propagate time synchronization information. Expert systems do not typically have any form of simulation capability. Furthermore, existing expert systems do not usually allow for integration with advanced analytical algorithms while maintaining real-time operation.

SUMMARY OF THE INVENTION

The present invention is specifically directed at real-time problems requiring both expert system technology and conventional algorithms inside a single operating environment capable of both simulation and automatic code generation for complex multirate and discrete event systems. A multirate system is a system where two or more subsystems have different task rates or time skews. A discrete event system is one which involves a single execution of the system (this is sometimes referred to as a triggered system). Automatic code generation involves a transformation of the system model into compilable computer source code. Such code generated according to the present invention is usable with commercially available processors.

This provides several advantages; including (1) object-oriented block-diagram specification of expert systems and other analytical algorithms; (2) no complex interfacing is required to pass knowledge from the expert system to or from conventional algorithms or other expert systems; (3) the capability for multiple expert systems with concurrent distributed intelligent strategies for real-time applications; (4) full inheritance of timing and synchronization properties of the parent subsystem; (5) expert systems in conjunction with other conventional modules can be simulated as part of a larger complex multirate and discrete event system; and (6) capability exists to automatically generate real-time compilable code software for the expert systems inside a complex multirate and discrete event system.

The present invention provides an environment which supports both expert system modules coupled with conventional algorithm modules capable of simulation and automatic code generation for complex multirate and discrete event systems. Each component of the system is defined using a pop-up graphical form (typically a window of useful information). A component is defined as the smallest unit of information of a conventional algorithm (such as a summing junction) or a single expert system. In the case of an expert system, the rules are edited one at a time along with the specification of other pertinent information such as the inference engine strategy, initial values, and truth boundaries. Each individual component of a modelled system is represented as a block. A series of blocks form a superblock which is a subsystem of the larger modelled system and may itself contain other nested superblocks or subsystems. Thus any system model may be represented as a set of subsystems and individual components.

Simulation of the system to be modelled then consists of the user providing a time vector and an input vector to the modeled system. The output vector then consists of the response of the modelled system to the input vector at each point marked by an output pin. The simulation model automatically organizes the catalog of superblock subsystems based on the operational rates and time skews. A similar module organizes superblocks for automatic code generation so that all superblocks operating with identical rates and time skews are organized within a single subsystem. Code is then generated for each subsystem as well as code for a scheduler to run the entire system. Each expert system block generates its own inference engine, set of parameters representing the knowledge base, and storage allocation for the data base.

Functionality of the expert system includes:
*if* conditions based on logical data and/or logical inputs and comparisons based on real-valued inputs and parameters;
*then-else* assertions for logical data, parameter updates based on parameters and inputs, and capability to stop the inference engine;
*priority* values for each rule;
*confidence* factors for assertions based on conditions;
*propagation* factors for combining new data values with old values;
*strategy* for the inference engine;
*maximum* executions for a single sample period;
*truth* boundaries for the conditionals; and
*history* capability to show which rules were fired at each sample period.

Though these capabilities represent a basis for expert system technology, other capabilities can be represented within the framework of the present invention including strategies using one or more heuristics in a sifting or combinational method; various ways of combining old information with new information with respect to the data base including methods requiring memory of past data values; obvious changes, additions, and deletions to the rule base including altering of confidences, priorities, and activation status; use of meta-knowledge, and basic debugging capabilities with respect to data values, rules fired, and the selection process of the inference engine.

BRIEF DESCRIPTION OF THE DRAWINGS

FIGS. 3 (*a*)-(*d*) show several modes of the expert system block user interface, and the rules manager;

FIG. 9 (*a*), (*b*), (*c*), and (*d*) show the storage for the expert system rulebase and database.

DETAILED DESCRIPTION OF THE INVENTION

The expert system block or module may be a conventional self-contained system composed of rules, database, and inference strategy. In this way the expert system module can be considered a subsystem, requiring its own scheduler. However, the scheduler in the expert system is contained entirely within the superblock or superior module in which the expert system module resides. Due to this key concept, the expert system is identical to any other computational block with respect to inputs, outputs, and maintenance of information within the superblock data rate of the superblock. More importantly, information is synchronized with analytical parts, preserving a signal flow graph operation, previously not found in other expert systems.

Figure 1A:
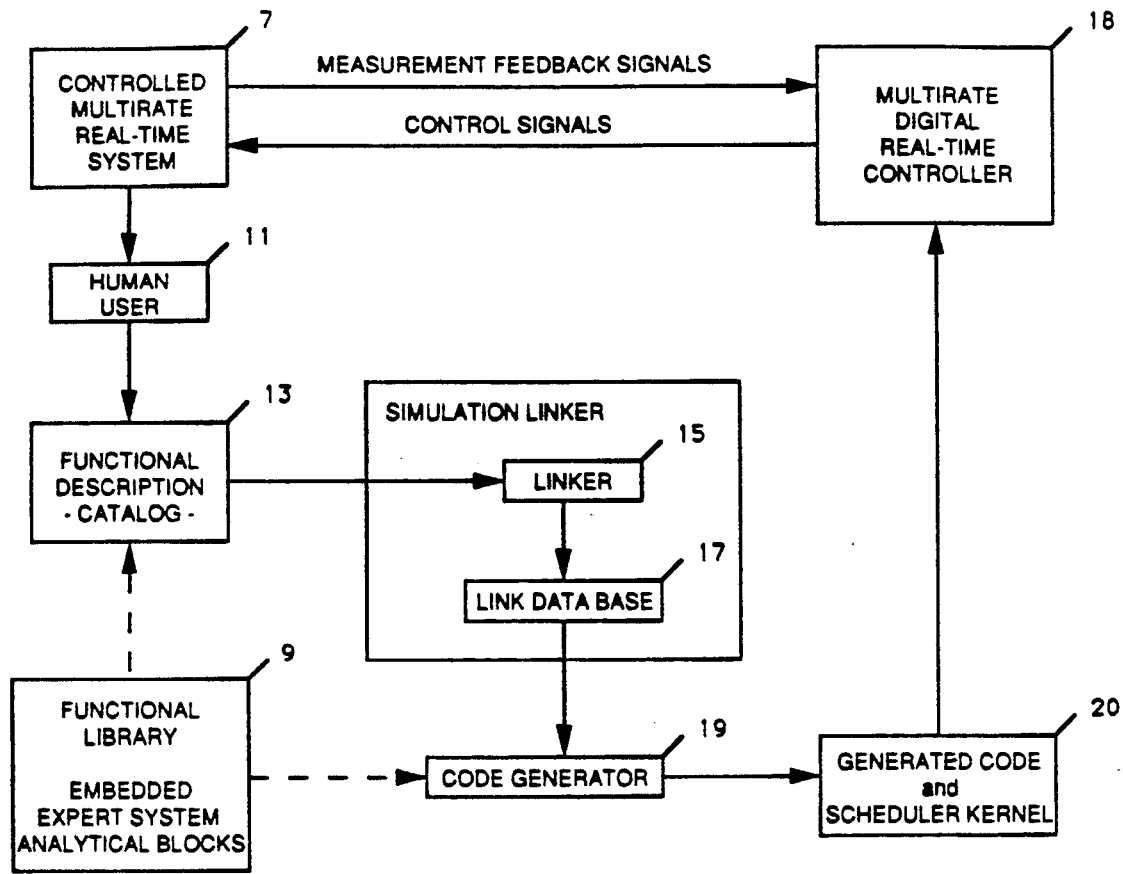
FIG. 1 (*a*) and (*b*) are block diagrams showing the relation between the present invention inside a real-time multirate system and a conventional expert system.
Figure 1B:
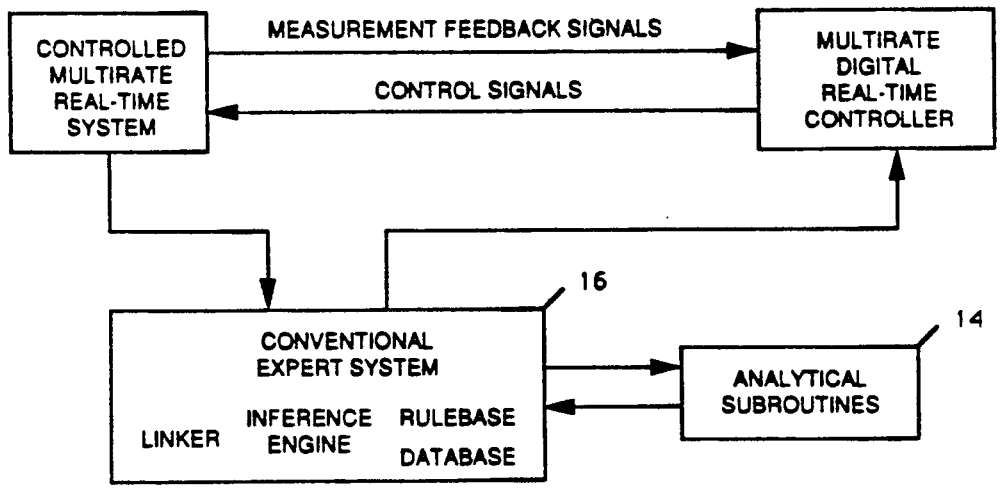

Specifically, and with reference to FIG. 1 (*a*), there is shown a block diagram of the basic system architecture. The controlled multirate real-time system 7 includes a conventional online system with tasks running at two or more scheduler rates. For example, an automobile cruise control system 7 may control the throttle at a rate different from the decision logic of cruise-control modes. A human user models this system using a graphical programming environment which includes a catalog 13 of blocks, each with a given functionality interpreted with the use of a functional library 9 hidden from the user. The catalog 13 consists of a palette of block icons including both computational algorithmic blocks and an expert system block. Each icon, once placed in a functional diagram, has parameters concerning the block functionality which can be edited using a user-interface that is displayed on a screen as a form. The user enters the desired parameters which are stored for future use by the functional library 9.

Two options are given to the user to analyze the modelled system. First, the user can model both the controller (and optionally the real-time system) inside the graphical programming environment and simulate the operation of the controller (and the system). The user can then choose to automatically generate compilable real-time code in a transportable high-level language for the controller portion of the diagram and download this code onto a processor to control the actual multirate real-time system 7. In either case, a linker 15, for example, of the type described in the aforecited U.S. Pat. No. 4,796,179 serves to utilize information concerning connections between blocks and super-blocks. This information is stored in a link data base 17 for use by either a simulation interpreter or the automatic code generator 19. In the case of the code generator 19, compilable code 20 is automatically generated, compiled, and downloaded to a real-time off-the shelf processor 18 such as an Intel 80386. The processor 18 acts as the controller for the real-time multirate system 7. An application specific scheduler kernel for the model holding all timing, synchronization, and communication information for each task is also generated in conjunction with the modelled controller 20.

This architecture of an expert system is distinctive from other expert systems in that it executes at a subsystem level. Conventional expert systems commonly employ an object-oriented paradigm in which the expert system makes calls to analytical subroutines. However, for real-time operation such conventional schemes do not allow for timing information and synchronization of the analytical components found inside real-time systems. This feature is desirable for true modelling and control of any realtime system. FIG. 1 (b) illustrates a block diagram of a conventional expert system which has control over all tasks that are called up, for example from an expert system shell, as subroutines. This conventional expert system is not set up in a block-like architecture where inputs can be passed in and combined with the results from other forms of calculations such as analytical mathematical functions that could be run in parallel with the expert system.

Figure 2:
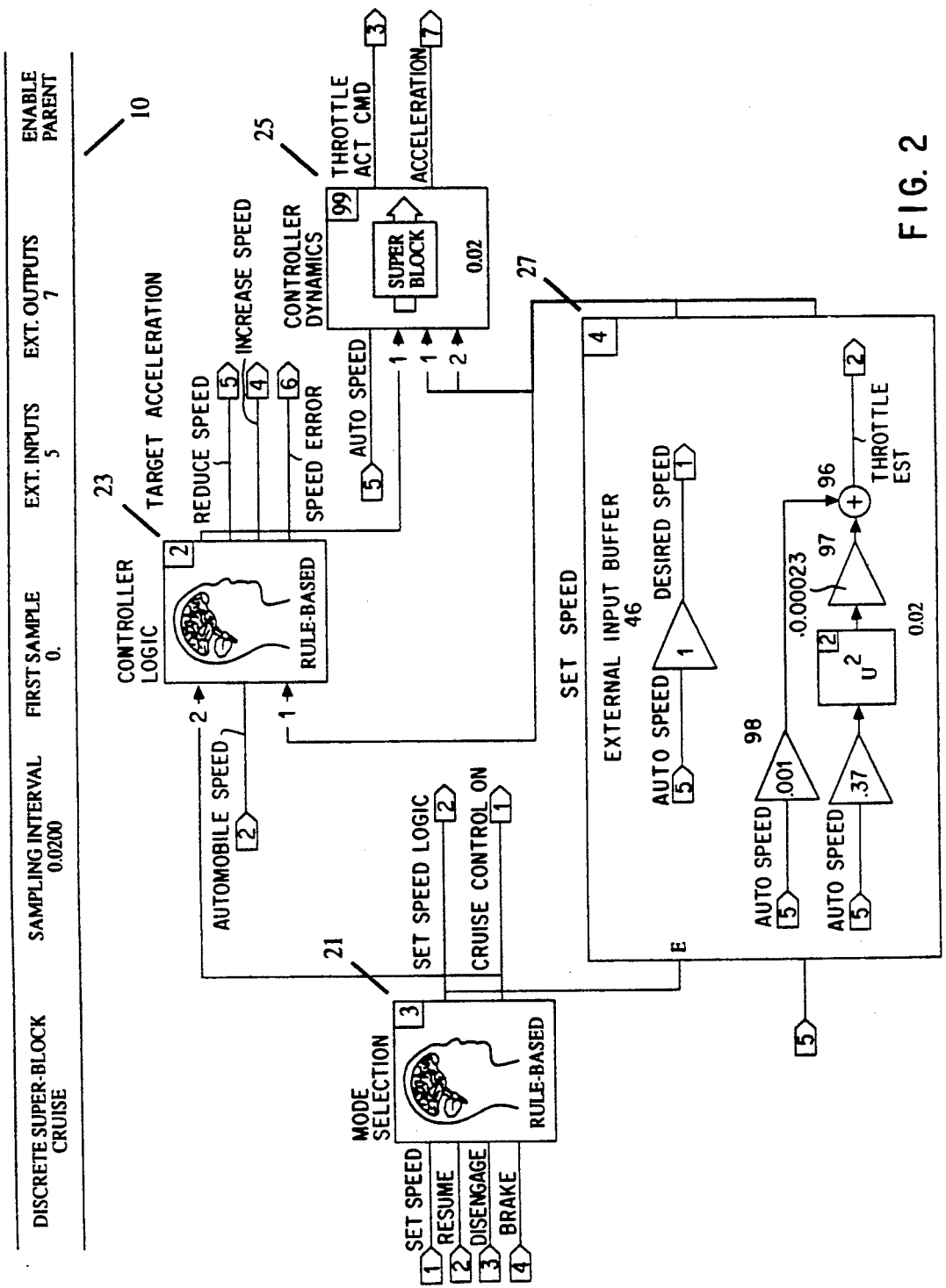
FIG. 2 illustrates an example of a functional description of an expert system inside a multirate real-time system.

Referring now to FIG. 2, the block diagram illustrates an icon representation of each functional block, including super-blocks (each of which may contain more blocks and other super-blocks) forming an expert cruise control system. A super-block is best understood as a grouping of other blocks, or as a subset of elements. Inputs and outputs to the system are flagged including the signal names given by the user. Connections between blocks are also displayed in the diagram. In the case of super-blocks, the scheduler rate is also displayed. The name of each block is also displayed in the diagram. At the top of the diagram pertinent information is displayed 10 describing the super-block being edited including the name, sampling rate, time skews, external inputs and outputs, and enable status. The super-block include two expert systems 21, 23 and two conventional super-block subsystems 25, 27. In the case of the set speed super-block 27, the blocks within the super-block are displayed.

The displayed control system contains four critical elements: the mode selection logic 21, the set speed logic 27, the controller logic 23, and the controller dynamics 25.

The mode selection logic 21 takes the user input from some mechanical device such as panel of buttons which consist of the following inputs: (1) set speed, telling the cruise control system to maintain the current automobile speed, (2) resume speed, telling the cruise control system to resume the speed at which the cruise control was last set (used mainly if the cruise system were interrupted by hitting the brakes), (3) disengage cruise control, which turns off the cruise control mechanism and associated memory of set speed, and (4) braking command, which also serves to temporarily deactivate the cruise control system (until resume speed is activated). The outputs from the mode selection logic block are used as switches to (1) alert other portions of the system to set the speed logic memory to the current speed and (2) alert the system and the cruise control is on.

The set speed logic 27 subsystem is a special type of subsystem known as an enable subsystem. The system performs its functionality only when a true signal is sent to the first input (notice the "E" denoting the enabled type). Otherwise, the system maintains the previous output values. In this case, the set speed logic is sent to this subsystem as the enabling signal. The other input to the system is the current automobile speed. When the first input is true (and the system is enabled), the current automobile speed is passed through an algebraic gain of one to become the desired speed. The automobile speed is also used to estimate the throttle position necessary to maintain the desired speed under steady state conditions. This is passed out as the second output.

The controller logic 23 takes three inputs: (1) the cruise control on signal, (2) the current automobile speed, and (3) the desired speed from the set speed module. The controller logic basically maintains one of three states: reducing the speed (deceleration), maintaining the speed (keeping a steady throttle), or increasing the speed (acceleration). Based on which of these three states is currently needed, a target acceleration is generated for the first output. The logicals reduce speed and increase speed denote two of the three states above. The speed error is merely the difference between the current speed and the desired speed.

The controller dynamics 25 represents the dynamic system utilizing the inputs of automobile speed, target acceleration, desired speed, and the steady state throttle estimate to generate the throttle command and calculate the instantaneous acceleration of the automobile. The internals of this subsystem can be any dynamic system which has the desired affect.

As can be seen, the expert system appears as any other block in the diagram with respect to connections and representation. Note that all timing and synchronization information will be preserved and that the expert system is tightly coupled with analytical algorithms. Thus the expert system is fully integrated and compatible with all other blocks in the diagram.

All information concerning the operation and information contained in the expert system is entered via the user interface. The user interface includes a displayed form, as shown in FIGS. 3a-3d which show several modes of entering information concerning the expert system. Information is entered to the form using a mouse and a keyboard. FIG. 3a shows a typical if-then-else rule which basically states that if the speed error is greater than 5, then the increase speed command is set to on, the reduce speed command is set to off, and the target acceleration is equated to the acceleration rate. The user has assigned a relative priority of 3 to the rule and a confidence of 1.00.

In FIG. 3b, the initial values of the block parameters are stored including the acceleration rate, which is initialized to 3. Note that all parameters including the target acceleration can also be set to an initial value if desired. FIG. 3c shows the ordering of the inputs to the block. The inputs indicated by the user in the expert system rules must be linked with the external inputs displayed near the lower left-hand corner of the form. Note that the names need not be identical. The output labels near the lower right-hand corner are entered by the user to match the names of data in the rulebase. In this case, the first three outputs may be calculated by the rule increase speed, as shown in FIG. 3a. Note that in each of the three modes in FIGS. 3a-3c, the middle section remains the same. This information allows the user to specify information concerning operation of the inference engine including the strategy, truth level (or boundary), and the maximum number of rule executions of the inference engine for one data cycle. Four more fields give the user a toggle choice concerning modes of operation for initialization and storage of data.

FIG. 3d shows a display of the rules manager interface of the expert system block. The rules are displayed as a window item displaying the rules' names and distinguishing characteristics. Functionalities include selection of a rule, entering a new rule, the parameters field, the inputs field, copying a rule, updating (or checking) the rulebase, and loading (saving) a rulebase to (from) a file. Rules can be sorted in several ways, for example, alphabetically.

Figure 4:
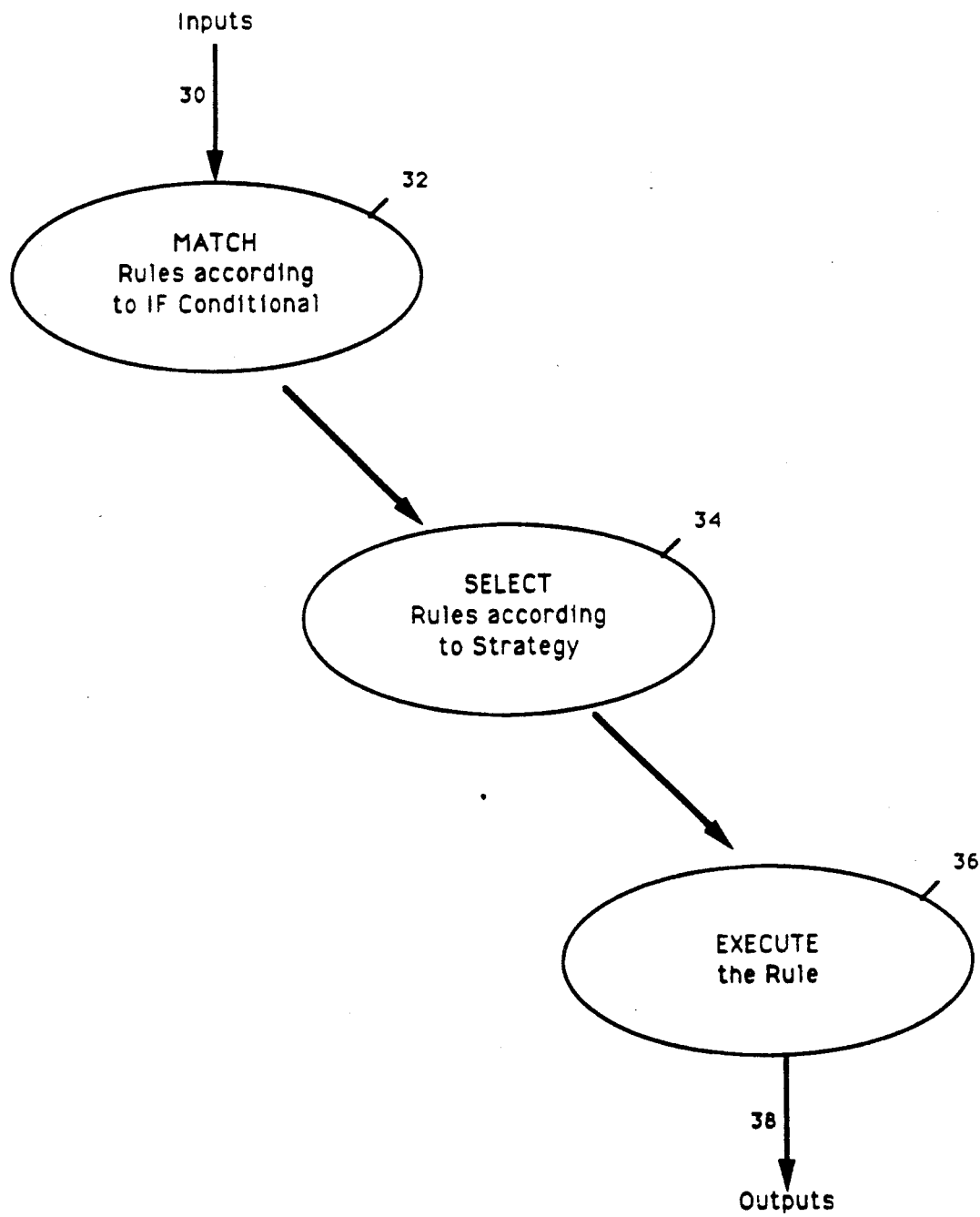
FIG. 4 shows the inference engine process of matching, selection, and execution.

Referring now to the block schematic diagram of FIG. 4, the general process of the inference engine includes an initialization step to acquire the inputs 30, a looping process consists of several steps including matching rules based on the conditionals 32, selecting a rule based on a strategy 34, execution 36 of that rule, and setting the outputs 38. The general process takes place all within one data sample period of the superblock in which the expert system resides, as more specifically described with reference to the flow chart of FIG. 5 in which the expert system is illustrated as having a single entry point and exit point, as later described herein.

Referring now to the flow chart of FIG. 5, the initialization of the inference engine of FIG. 4 consists of acquiring the inputs on the system bus, as later described herein. The real-valued inputs 33 are then used to make any comparisons in the if portions of all rules. External inputs may be used, as well as internal parameters 35, in forming the comparisons. The result of each comparison and the logical inputs are stored directly into the logical database 39. While conventional expert systems use string matching for the if conditions of a rule, this is unacceptable for realtime operation. Therefore, an internal linker is included in accordance with the present invention, inside the expert system that encodes a look-up table for the various inputs and parameters, and the logistics formed. Thus, as illustrated in FIG. 9(a), a real-valued input 71 and/or parameter 75 are passed through to a comparator 73 and are evaluated to a logical piece of data along with logical inputs 77 and other logical data 79. Although this results in a requirement for larger memory for storage, it is a trade-off that must be made for real-time calculations.

The if conditions of each rule are evaluated 37 with respect to a predefined truth level. The confidence in the if condition is applied, using Bayesian logic, to the confidence level in the rule to form a confidence in the assertion. Those rules which qualify are placed on the agenda 43 and are available for selection. In accordance with the present invention, the confidence in the rule is actually passed into the expert system as an input in contrast to conventional expert systems which generally do not allow for the analytical components of the system to interact with the expert system.

The strategy is used to select rules from the agenda. Typically, a group of heuristics, or rules-of-thumb 45, are used to select a single rule from the agenda. The strategy uses the heuristics to filter out rules until either only one rule is left or the heuristics are exhausted 47 and a rule is chosen at random. This method allows for user-defined strategies of choosing rules. A typical heuristic is a simple test of merit about the rule or data components comprising the rule. For example, utilizing a user-assigned priority is typically employed as a heuristic. Here again, an input can actually be used to specify the priority of the rule thus allowing outside agents such as other expert systems or analytical systems to decide how important a rule (or set of rules) may be at any given time. By allowing this type of operation, a form of metaknowledge, or knowledge applied to rules themselves can be achieved. Metaknowledge of conventional expert systems must typically be applied in an object-oriented fashion, resulting in operations too slow for real-time.

Figure 6A:
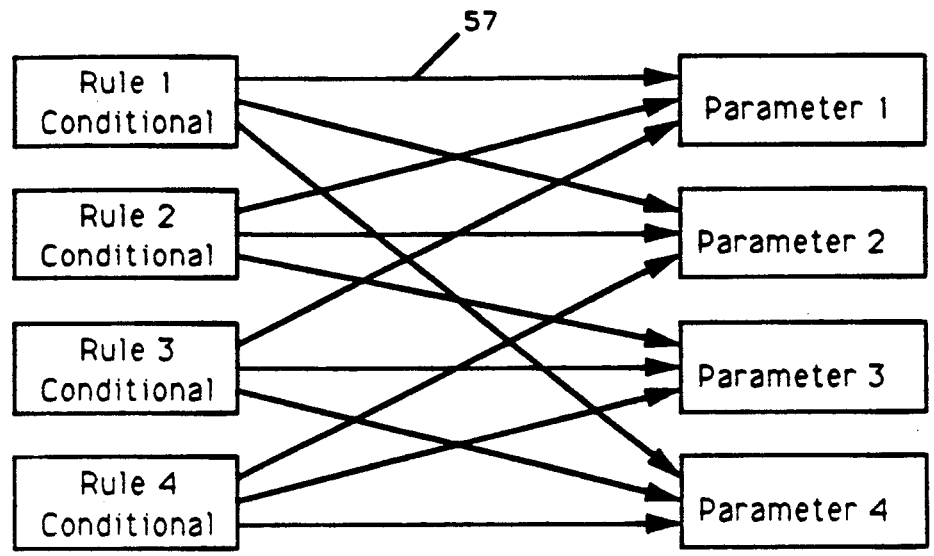
FIGS. 6 (*a*) and (*b*) are pictorial representations of linked and reverse linked lists useful for faster execution speed in referencing information.
Figure 6B:
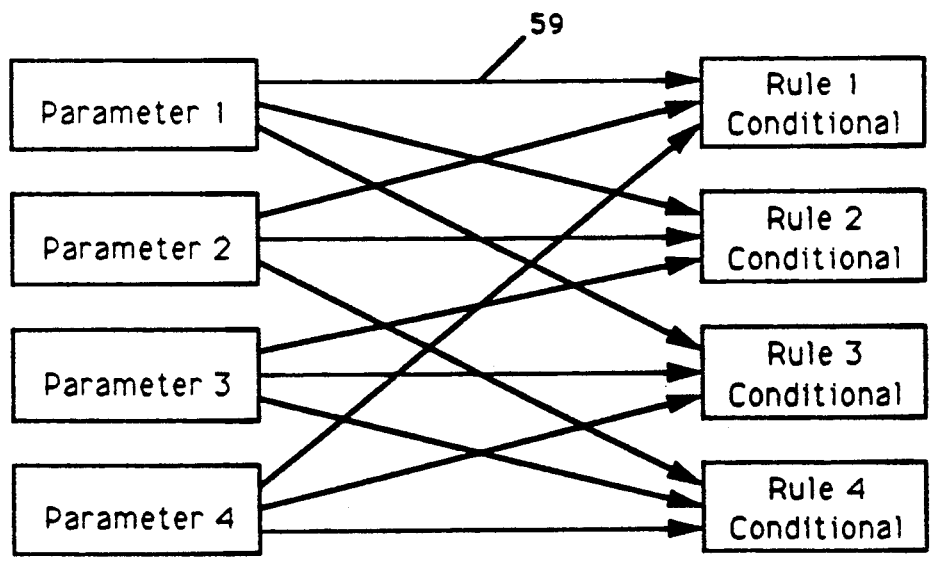

The selected rule is then executed 49, consisting of all of the then (or else) conditions, given that the rule was deemed true (or false). The rule is then taken off the agenda until the execution of another rule places the rule back on the agenda. At this point, the if conditions of those rules affected by the executed rule are reevaluated by using the new logical data 39 and parameters 42 formed by the assertions of the executed rule 49. The entire process of comparison from 33 and 35 must be reevaluated as well as the if conditions of the rule 37 using the logical data formed and stored in memory 39. Once again, extra linked lists must be created for real-time operation. This storage is not used in conventional expert systems due to the huge memory requirements, but is crucial for real-time execution of the rulebase. These lists actually contain redundant information, but in a reverse look-up fashion to ensure quicker execution speed. Thus, as illustrated in the charts of FIGS. 6(a) and 6(b), only the links from the if conditions of rules 57 are used. In order to see if the state of a conditional has changed, the state of a parameter forming the conditional must change. In order to do this, each conditional would have to search through all its parameters to see if each parameter forming the conditional has changed. This is fairly time consuming. However, in accordance with the present invention, a linked list is created 59 which lists the if conditions of rules that are affected by the changing of a parameter. Then, only those conditionals which are associated with a changed parameter need to be checked and reevaluated.

Figure 5:
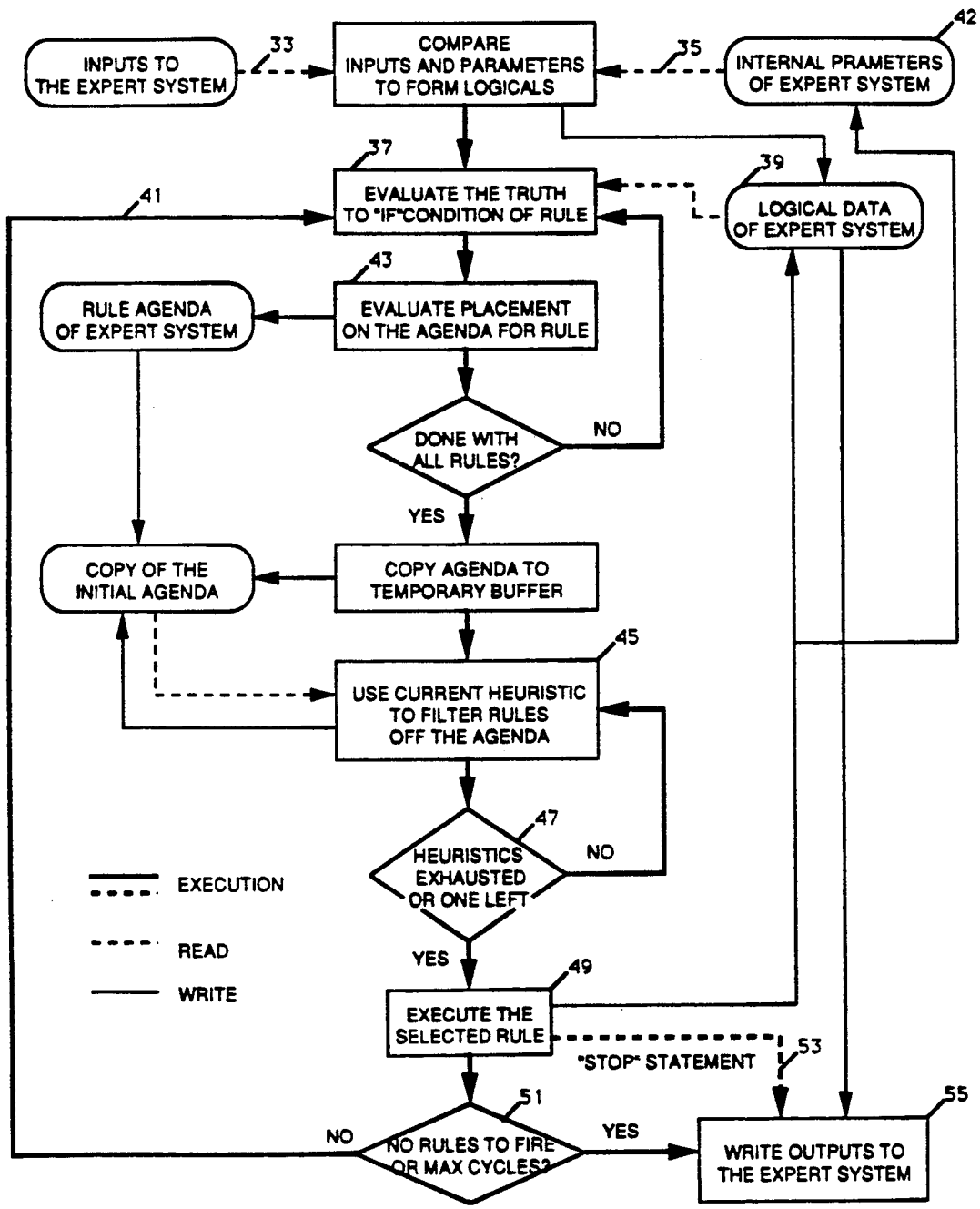
FIG. 5 shows the operation of the inference engine within a single data sample period.

This match, select, and execute process continues, as illustrated in the flow chart of FIG. 5, until either: (i) the maximum number of executions (specified by the user) 51 is reached, (ii) no rules are left on the agenda 51, or (iii) a stop statement 53 is encountered in the rule where the user explicitly tells the inference engine to halt execution for that data sample period once a desirable conclusion has been reached). Once all the rules have been executed, the outputs are written 55 to the system bus. The maximum number of executions is often crucial in conforming to the hard timing constraints, and is usually important for maintaining hard deadlines found in a real-time expert system.

Figure 7:
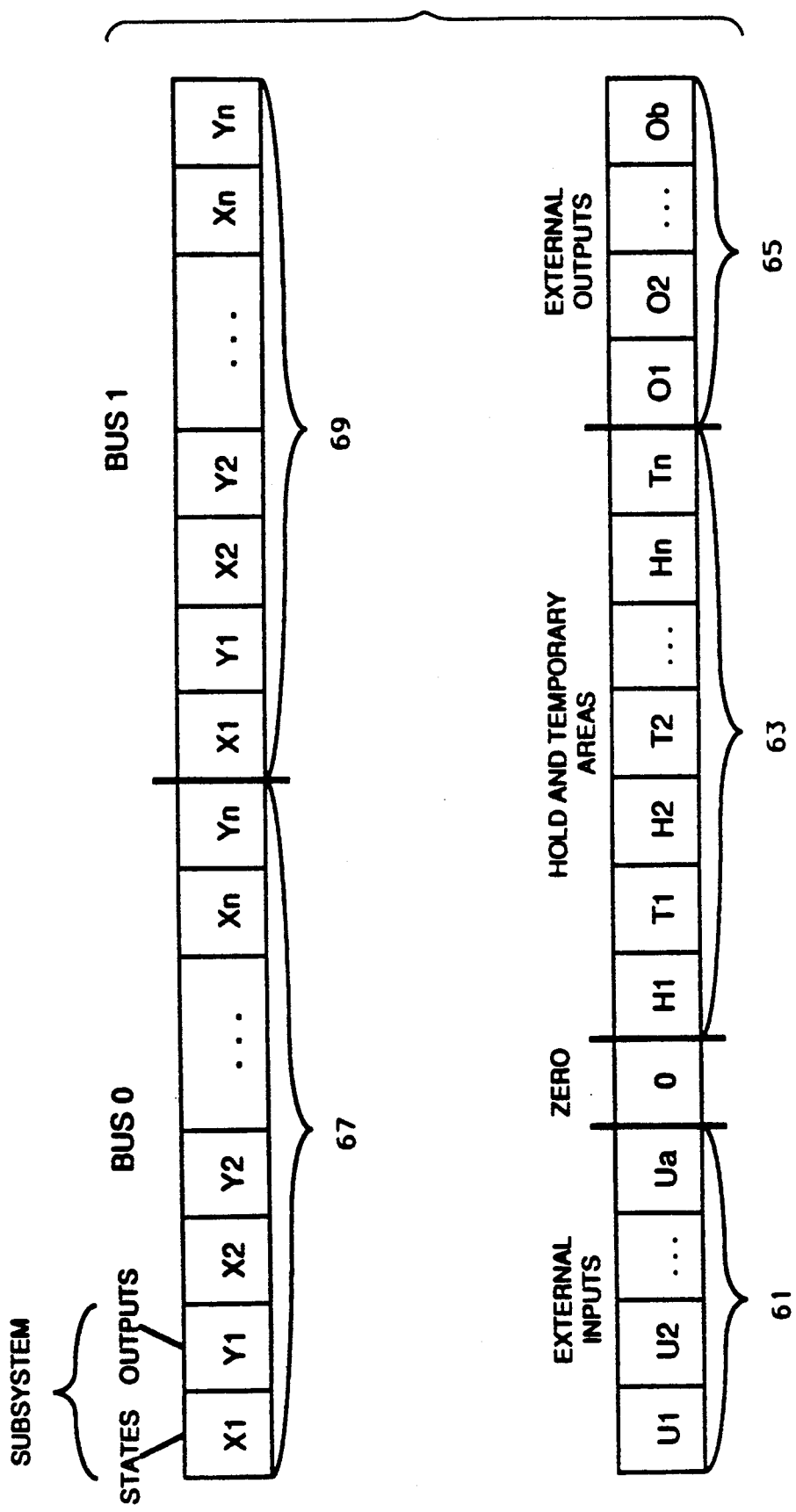
FIG. 7 represents the location of the storage of the data base for the expert system with respect to the system states and other data.

Referring now to FIG. 7, there is shown a pictorial representation of the basic storage of information of each block in the system bus. The system bus contains five sections, as illustrated, including the first bus 67, the second bus 69, the external inputs 61, hold and temporary areas 63, and the external outputs 65. The external inputs section 61 contains all inputs to the system, and the Hold and Temporary Areas 63 contain all information for sampled signals or zero-order holds essential for multirate systems. Finally, an external outputs section 65 holds the output values for the system. Storage in multirate real-time systems is described in detail in the cited U.S. Pat. No. 4,796,179. The system bus contains five various components, as illustrated in FIG. 7. Bus 0 and bus 1 (67, 69) are a means of double buffering the outputs and states of each component of the system. For example, at the discrete time unit, k:

$$Y1(n,k) = f[X0(n,k-1), U(n)]$$

$$X1(n,k) = f[X0(n,k-1), U(n)]$$

where n denotes the nth block of the system and f[x,u] denotes some functionality using the quantities x and u. In the next time unit, k+1, the information gathered previously forms:

$$Y0(n,k+1) = f[X1(n,k), U(n)]$$

$$X0(n,k+1) = f[X1(n,k), U(n)]$$

With this system no extra copying or temporary calculational space is necessary from operation to operation. This set up assumes operation as a zero order hold where the information is calculated at time period nT and stays the same until the next time period (n+1)T:

$$X(nT + \Delta t) = X(nT) \quad 0 < = \Delta t < T$$

This feature maintains a constant input vector stored in section 61 of the bus, and constant connections between blocks stored in the hold and temporary areas 63 of the bus, and maintains the external outputs 65.

Figure 8:
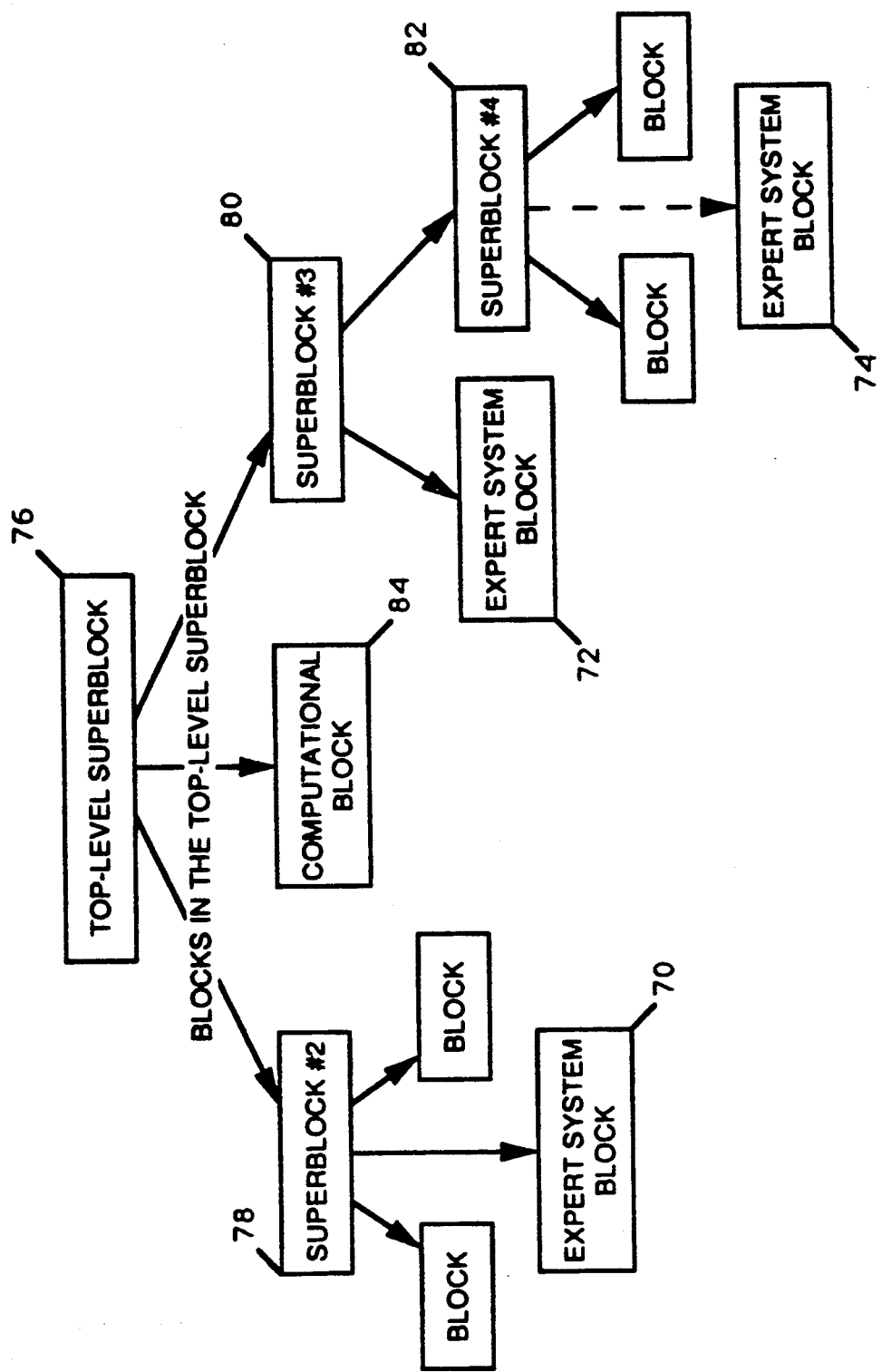
FIG. 8 represents the top-down structure of a real-time multirate system with embedded expert system modules.

FIG. 8 shows a typical top-down structure of a real-time multirate system. Each of the blocks, including the expert system block(s) 70, 72, 74, reserves space for their outputs and states on bus 0 and bus 1, as illustrated in FIG. 7. Information concerning inputs to each super-block 76, 78, 80, 82 is stored in the hold and temporary areas 63 where a zero-order hold can be maintained for achieving synchronization across concurrent subsystems executing in a distributed system. At the system level, the top-level superblock 78 contains superblock #2 (78), superblock #3 (80), and a computational block 84. The subsystem level of superblock #3, for example, includes an expert system block 72 and superblock #4 (82). Thus, each system can be broken down into subsystems of superblocks and either computational blocks or expert system blocks which are linked together with connections between outputs of these components to inputs of other components. At the lowest subsystem level only computational blocks 84 and expert system blocks 70, 72, 74 are left.

The storage of the expert system database is enclosed in the state information, as would be done with any block (e.g. 67 of FIG. 7). The pictorial illustrations of FIGS. 9 a)-d) show the basic stages in the process and how database information is formed. First, storage is needed for the real-valued inputs 71. Comparisons 73 of parameters 75 and/or inputs 71, logical inputs 77, and logical data 79 must be stored in a data section that includes all logical results thus formed 81. Note that some of the logical results formed are later passed as outputs 93 to the expert system once all inferencing has been done.

In FIG. 9b, the data 81 is combined using the conjunction 85 in the conditional (e.g. data A and data B and data C), and then combined with the Bayesian confidence in the rule 87 to form the overall confidence 88 in the conditional (i.e. the probability in the rule P (r) is the probability of its conditions P (c) multiplied by the Bayesian probability of the rule given its conditions P (r/c)). This confidence is then compared 89 with the truth level necessary for classification 91. This truth level is specified as to the confidence necessary for a rule to be declared 83 as: (1) true (above that level), (2) false (below one minus that level), or (3) unknown. This classification forms the rule agenda of all rules initially available to be picked for execution, and describes the evaluation steps 37, 43 discussed earlier with reference to FIG. 5.

In FIG. 9c, a rule from the agenda 95 is selected 97 according to step 45, 47 previously discussed with reference to FIG. 5. The assertions of the rule 99 then form new logical data 81, parameters 75, and carry out any possible inferencing commands 101 such as stopping the inference engine, as illustrated at 53 in FIG. 5.

FIG. 9d shows the distinct areas of storage for the dynamic information database utilized in the above steps. the parameter section 103 contains the values of the parameters 75. The data status 105, the data value 107, and the data timetag 109 relate to the data 81 as defined by the rule assertions 99. A timetag is simply the time of which the piece of information was last updated. The rule value 111 and rule timetag 113 and rule status 115 relate to the agenda 83 of rules.

What is claimed is:

1. A method of operating a multirate real-time expert system, comprising:
    providing a computer having at least one central processing unit and memory for storing data and software;
    storing, in said memory, system definition data representing said multirate real-time system as a set of interconnected functional blocks, including data specifying computations to be performed each time one of said functional blocks is executed, said system definition data also specifying external input signals and external output signals for said multirate real-time system;
    defining subsets of said functional blocks as subsystems of the multirate real-time system;
    at least one subset of said functional blocks comprising a rule-based expert subsystem, said data specifying computations to be performed by said rule-based expert subsystem including data representing a plurality of logical rules, rule selection software for selecting a subset of said rules for execution, and rule execution software for executing the selected subset of rules to produce a set of output signal values;
    defining in said memory a double buffer interface for storing input and output signal values associated with said functional blocks, including defining: (A) an output signal buffer for holding output signal values generated by said functional blocks during execution thereof, and (B) a sample and hold buffer for each said subsystem;
    scheduling and executing said specified computations associated with said defined subsystems; and
    prior to executing said specified computations associated with each said defined subsystem, copying into said sample and hold buffer for each said defined subsystem all input signal values to be used by said specified computations, and holding said input signal values copied into said sample and hold buffer invariant during execution of said specified computations associated with each said defined subsystem;
    whereby a consistent set of input signal values is presented to said rule-based expert system regardless of changing values of associated ones of said input signals.

2. The method of claim 1,
    wherein said output signal buffer comprises:

two equal size output buffers for each defined subsystem, each equal size output buffer holding output signal values and internal state variables of said defined subsystem; and flag means, for each defined subsystem, having a value indicating which of said two equal size output buffers is used during each execution of said functional blocks in said subsystem;

said scheduling step including changing the value of said flag means associated with each defined subsystem prior to execution of said functional blocks in said defined subsystem, and copying into said sample and hold buffer specified output signals from the one of said two equal size output buffers of other defined subsystems not currently designated by said flag means.

3. The method of claim 1, defining for each said subsystem a computation initiation condition comprising a computational trigger condition for asynchronous subsystems and a computational repetition rate and skew period for synchronous subsystems;

said rule-based expert subsystem comprising a synchronous subsystem having an associated computational repetition rate and skew period;

said scheduling and executing step including:

defining said computational repetition rate and skew period for said rule-based expert subsystem based on a specified output signal schedule of times at which output signals from said rule-based expert subsystem are needed; and scheduling initiation of execution of said specified computations associated with said rule-based expert subsystem based on said defined output signal schedule.

4. The method of claim 1, defining for each of a plurality of said subsystems a computational repetition rate and skew period based on a specified output signal schedule of times at which output signals from subsystems are needed; and scheduling initiation of execution of said specified computations associated with said plurality of said subsystems based on said defined output signal schedule.

5. The method of claim 1, said data representing a plurality of logical rules includes a set of pre-computed interrelations between data and rules which is stored as a linked list of interrelations used by said rule selection software for selecting a subset of said rules for execution.

6. The method of claim 1, said rule selection software includes software for forming a selectable hierarchical ordering of heuristics by which rules are selected.

7. The method of claim 1, said rule selection software allows confidence levels and priority levels associated with said plurality of logical rules to vary with time.

8. The method of claim 1, said multirate real-time system including a plurality of rule-based expert subsystems.

9. The method of claim 7, wherein each of said plurality of rule-based expert subsystems comprises a distinct synchronous subsystem of said multirate real-time system having an associated computational repetition rate and skew period.

10. A method of simulating operation of a multirate real-time expert system, comprising:

providing a computer having at least one central processing unit and memory for storing data and software;

storing, in said memory, system definition data representing said multirate real-time system as a set of interconnected functional blocks, including data specifying computations to be performed each time one of said functional blocks is executed, said system definition data also specifying external input signals and external output signals for said multirate real-time system; said specified computations simulating operation of corresponding portions of said multirate real-time expert system;

defining subsets of said functional blocks as subsystems of the multirate real-time system;

at least one subset of said functional blocks comprising a rule-based expert subsystem, said data specifying computations to be performed by said rule-based expert subsystem including data representing a plurality of logical rules, rule selection software for selecting a subset of said rules for execution, and rule execution software for executing the selected subset of rules to produce a set of output signal values;

defining in said memory a double buffer interface for storing input and output signal values associated with said functional blocks, including defining: (A) an output signal buffer for holding output signal values generated by said functional blocks during execution thereof, and (B) a sample and hold buffer for each said subsystem;

scheduling and executing said specified computations associated with said defined subsystems; and prior to executing said specified computations associated with each said defined subsystem, copying into said sample and hold buffer for each said defined subsystem all input signal values to be used by said specified computations, and holding said input signal values copied into said sample and hold buffer invariant during execution of said specified computations associated with each said defined subsystem;

whereby a consistent set of input signal values is presented to said rule-based expert system regardless of changing values of associated ones of said input signals.

11. The method of claim 10, wherein said output signal buffer comprises:

two equal size output buffers for each defined subsystem, each equal size output buffer holding output signal values and internal state variables of said defined subsystem; and flag means, for each defined subsystem, having a value indicating which of said two equal size output buffers is used during each execution of said functional blocks in said subsystem;

said scheduling step including changing the value of said flag means associated with each defined subsystem prior to execution of said functional blocks in said defined subsystem, and copying into said sample and hold buffer specified output signals from the one of said two equal size output buffers of other defined subsystems not currently designated by said flag means.

12. The method of claim 10, defining for each said subsystem a computation initiation condition comprising a computational trigger condition for asynchronous subsystems and a computational repetition rate and skew period for synchronous subsystems;

said rule-based expert subsystem comprising a synchronous subsystem having an associated computational repetition rate and skew period;

said scheduling and executing step including:

defining said computational repetition rate and skew period for said rule-based expert subsystem based on a specified output signal schedule of times at which output signals from said rule-based expert subsystem are needed; and scheduling initiation of execution of said specified computations associated with said rule-based expert subsystem based on said defined output signal schedule.

13. The method of claim 10, defining for each of a plurality of said subsystems a computational repetition rate and skew period based on a specified output signal schedule of times at which output signals from subsystems are needed; and scheduling initiation of execution of said specified computations associated with said plurality of said subsystems based on said defined output signal schedule.

14. The method of claim 10, said data representing a plurality of logical rules including a set of pre-computed interrelations between data and rules which is stored as a linked list of interrelations used by said rule selection software for selecting a subset of said rules for execution.

15. The method of claim 10, said rule selection software including software for forming a selectable hierarchical ordering of heuristics by which rules are selected.

16. The method of claim 10, wherein said rule selection software allows confidence levels and priority levels associated with said plurality of logical rules to vary with time.

17. The method of claim 10, said multirate real-time system including a plurality of rule-based expert subsystems.

18. The method of claim 17, wherein each of said plurality of rule-based expert subsystems comprises a distinct synchronous subsystem of said multirate real-time system having an associated computational repetition rate and skew period.

19. A multirate real-time expert computer system, comprising:

a computer having at least one central processing unit and memory for storing data and software;

system definition means coupled to said memory for storing, in said memory, system definition data representing said multirate real-time system as a set of interconnected functional blocks, including data specifying computations to be performed each time one of said functional blocks is executed, said system definition data also specifying external input signals and external output signals for said multirate real-time system;

said system definition means defining subsets of said functional blocks as subsystems of the multirate real-time system;

at least one subset of said functional blocks comprising a rule-based expert subsystem, said data specifying computations to be performed by said rule-based expert subsystem including data representing a plurality of logical rules, rule selection software for selecting a subset of said rules for execution, and rule execution software for executing the selected subset of rules to produce a set of output signal values;

a double buffer interface in said memory for storing input and output signal values associated with said functional blocks, including (A) an output signal buffer for holding output signal values generated by said functional blocks during execution thereof, and (B) a sample and hold buffer for each said subsystem;

an execution scheduler which schedules and initiates execution of said specified computations associated with said defined subsystems; and sample and hold means, responsive to said execution scheduler, for copying into said sample and hold buffer, prior to executing said specified computations associated with each said defined subsystem, all input signal values to be used by said specified computations, and for holding said input signal values copied into said sample and hold buffer invariant during execution of said specified computations associated with each said defined subsystem;

whereby a consistent set of input signal values is presented to said rule-based expert system regardless of changing values of associated ones of said input signals.

20. The multirate real-time expert computer system of claim 19, wherein said output signal buffer comprises:

two equal size output buffers for each defined subsystem, each equal size output buffer holding output signal values and internal state variables of said defined subsystem; and flag means, for each defined subsystem, having a value indicating which of said two equal size output buffers is used during each execution of said functional blocks in said subsystem;

said execution scheduler changing the value of said flag means associated with each defined subsystem prior to execution of said functional blocks in said defined subsystem, and copying into said sample and hold buffer specified output signals from the one of said two equal size output buffers of other defined subsystems not currently designated by said flag means.

21. The multirate real-time expert computer system of claim 19, said system definition means defining for each said subsystem a computation initiation condition comprising a computational trigger condition for asynchronous subsystems and a computational repetition rate and skew period for synchronous subsystems;

said rule-based expert subsystem comprising a synchronous subsystem having an associated computational repetition rate and skew period;

said execution scheduler (A) defining said computational repetition rate and skew period for said rule-based expert subsystem based on a specified output signal schedule of times at which output signals from said rule-based expert subsystem are needed, and (B) scheduling initiation of execution of said specified computations associated with said rule-based expert subsystem based on said defined output signal schedule.

22. The multirate real-time expert computer system of claim 19,
   said system definition means defining for each of a plurality of subsystems a computational repetition rate and skew period based on a specified output signal schedule of times at which output signals from subsystems are needed; and
   said execution scheduler scheduling initiation of execution of said specified computations associated with said plurality of said subsystems based on said defined output signal schedule.

23. The multirate real-time expert computer system of claim 19, said data representing a plurality of logical rules including a set of pre-computed interrelations between data and rules which is stored as a linked list of interrelations used by said rule selection software for selecting a subset of said rules for execution.

24. The multirate real-time expert computer system of claim 19, said rule selection software including software for forming a selectable hierarchical ordering of heuristics by which rules are selected.

25. The multirate real-time expert computer system of claim 19, wherein said rule selection software allows confidence levels and priority levels associated with said plurality of logical rules to vary with time.

26. The multirate real-time expert computer system of claim 19, said multirate real-time system including a plurality of rule-based expert subsystems.

27. The multirate real-time expert computer system of claim 26, wherein each of said plurality of rule-based expert subsystems comprises a distinct synchronous subsystem of said multirate real-time system having an associated computational repetition rate and skew period.

* * * * *